United States Patent
Kohsiek

(10) Patent No.: US 6,559,705 B1
(45) Date of Patent: May 6, 2003

(54) CIRCUIT ARRANGEMENT

(75) Inventor: Cord-Heinrich Kohsiek, Ellerau (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/173,345

(22) Filed: Jun. 17, 2002

(51) Int. Cl.[7] ............................ G06G 7/24; H03G 11/08
(52) U.S. Cl. ........................................ 327/352; 327/350
(58) Field of Search ............................... 327/350, 351, 327/352

(56) References Cited

U.S. PATENT DOCUMENTS

| | | | | |
|---|---|---|---|---|
| 5,298,811 A | * | 3/1994 | Gilbert ........................ | 327/351 |
| 5,417,166 A | * | 5/1995 | Credle, Sr. ................ | 108/50.12 |
| 5,506,537 A | * | 4/1996 | Kimura ........................ | 327/351 |
| 6,483,367 B2 | * | 11/2002 | Kohsiek ....................... | 327/352 |

FOREIGN PATENT DOCUMENTS

| | | | | |
|---|---|---|---|---|
| WO | WO0233822 | 10/2001 | ............ | H03G/7/00 |

* cited by examiner

*Primary Examiner*—Toan Tran
(74) *Attorney, Agent, or Firm*—Steven R. Biren

(57) ABSTRACT

In order to provide a circuit arrangement (100) for generating and amplifying a DC signal, referred to as level voltage, whose value is essentially proportional to the logarithm of the voltage amplitude of the input signal, the circuit arrangement comprising an amplifier circuit having at least two amplifier stages (10; 20; 30), it is proposed that at least a differential amplifier stage (40), in particular non-negatively fed back, is arranged parallel to the last amplifier stage (30), particularly parallel to the collector circuits of the last amplifier stage (30), the differential amplifier stage (40) precedes at least a multiplier stage (50) for multiplying the output signals of the differential amplifier stage (40), for generating two differential amplifier output signals which are to be multiplied by each other, and alternatively to the differential amplifier (40), the collector currents of the transistors (36, 38) of the rectifier circuit (35) of the last amplifier stage (30) are used, and at least a current adder unit (80) is provided for adding the level voltage of the output signal of the multiplier stage (50) to the respective level voltage of the other amplifier stages.

15 Claims, 4 Drawing Sheets

CIRCUIT ARRANGEMENT

Figure 1:
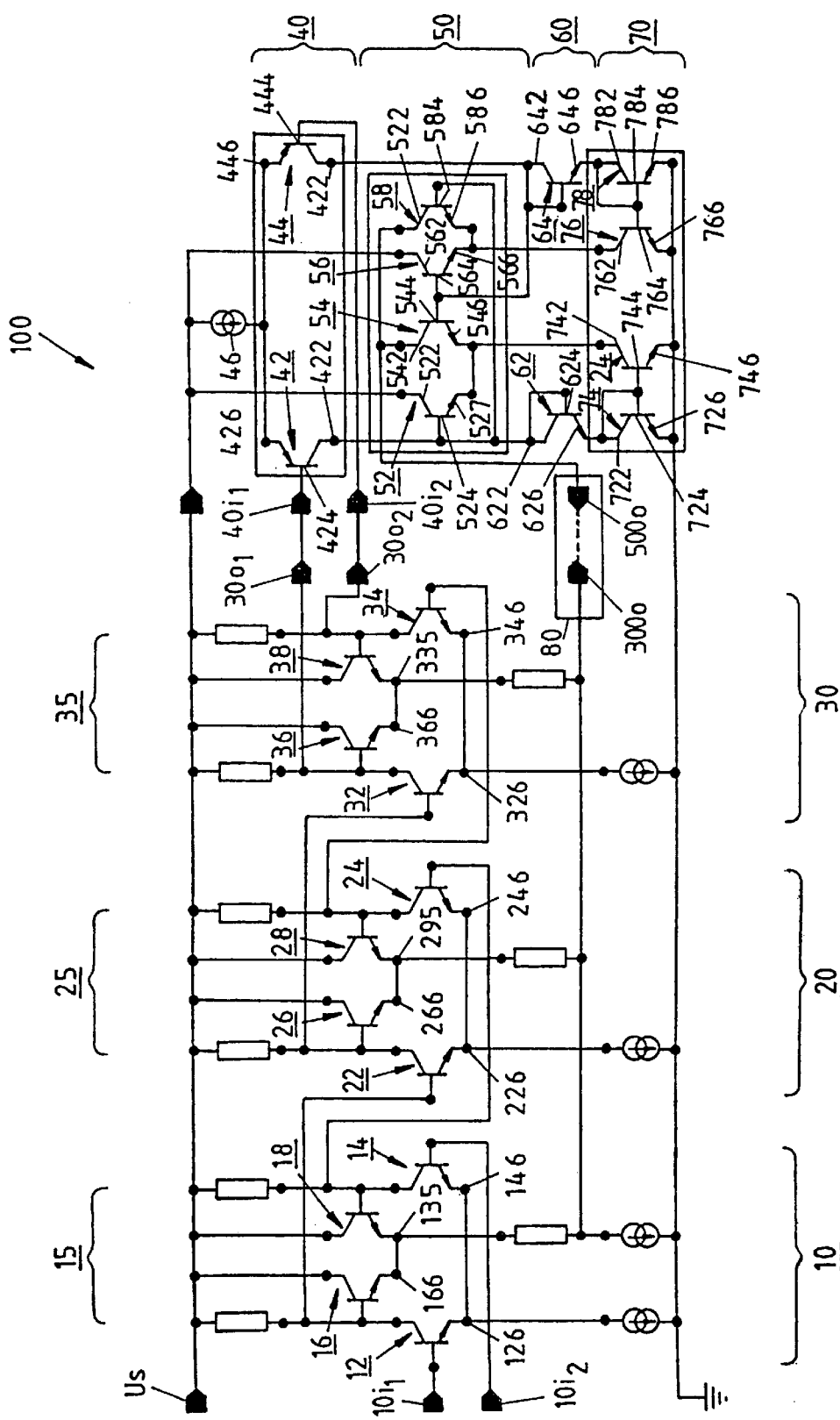

The invention relates to a circuit arrangement for generating and amplifying a DC signal, referred to as level voltage, whose value is essentially proportional to the logarithm of the voltage amplitude of the input signal, the circuit arrangement comprising an amplifier circuit having at least two amplifier stages. In general, the present invention relates to the field of analog integrated circuits.

Such circuit arrangements fulfill two functions. They are used for amplifying an AC voltage signal which is applied to the circuit arrangement via its input terminals; simultaneously, such a circuit arrangement limits the amplitude of the output signal. Consequently, the term "limiter amplifier" is also used for such a circuit arrangement. Such limiter amplifiers are used in, for example, the frequency-modulated IF amplification in radio receivers or when gaining carriers from amplitude-modulated signals.

When a simple extension, for example, in the form of a rectifier stage is realized in such a limiter amplifier, a direct voltage can be generated which within wide ranges is proportional to the logarithm of the amplitude of the voltage of the input signal. When the amplitude of the output signal is plotted against the logarithm of the amplitude of the input voltage, a wide range of the input voltage shows a straight part with an essentially constant increase. This straight part is generally indicated as the "level characteristic". In this case, the start, i.e. the variation of this level characteristic at small input voltages is dependent on the selected amplification of the limiter amplifier. In other words, this means that the variation of the level characteristic at small input voltages cannot be chosen independently of the gain factor of the circuit arrangement.

The prior art discloses a possibility to extend the level characteristic to larger input voltages (cf. document WO 97/14212), but this does not answer the question in how far level indications can be extended to smaller input voltages. A conventional possibility of extending the level characteristic to smaller input voltages is the addition of a further amplifier stage. However, this requires a larger amplification so that it may give rise to difficulties regarding negative feedback and/or an offset and/or a larger current consumption and/or the oscillation stability.

Based on the above-mentioned drawbacks and shortcomings, the present invention has for its object to provide a circuit arrangement of the type described in the opening paragraph, in which the level characteristic can be extended towards small input signals without increasing the amplification, for example, by means of adding a further amplifier stage.

This object is solved by a circuit arrangement as defined in claim 1. Advantageous embodiments and essential further improvements of the present invention are defined in the dependent claims.

Regarding the present invention, it should be noted that the emitter follower (collector circuits) of the full-wave rectifier of the last amplifier stage have a significant share in the level characteristic when the voltage at the respective base is of the order of the temperature voltage.

For this reason, the at least one differential amplifier stage, in combination with the at least one multiplier stage, contributes to the level characteristic below the range of a temperature voltage, which contribution is the larger as the input voltage at the circuit arrangement is smaller (principally, a linearly amplifying DC amplifier whose output voltage is proportional to the difference between the two input voltages is concerned in this respect. The basic circuit comprises two transistors combined at the emitter and fed from a common constant current source. The differential amplifier is usually symmetrical because temperature influences and non-linearities are then substantially compensated, with a small offset behavior as a result).

In accordance with the teaching of the present invention, the at least one differential amplifier stage is arranged parallel to the emitter followers of the last amplifier stage, and its output signals are multiplied in at least one multiplier stage. This product is added in the at least one current adder unit to the parts of the level characteristic of the other amplifier stages preceding the last amplifier stage and in this way supplies a significant contribution to the level characteristic already at input signals below the rectifying action of the emitter followers (collector circuits) of the last amplifier stage.

In accordance with a particularly inventive further improvement of the circuit arrangement, the slope of the additional part of the characteristic can be varied towards smaller level voltages of the circuit arrangement via the current supplied by at least a current source of the differential amplifier. The level characteristic can also be extended at very small currents in the added differential amplifier stage when high-ohmic resistors are inserted.

As regards the present invention, those skilled in the art will appreciate that an extension of the level indication or an extension of the level characteristic towards smaller voltages can be achieved with the circuit arrangement—at a smaller current consumption—, without an offset problem and/or negative feedback problem occurring—as in conventional circuit arrangements with additional amplifier stages.

The invention also relates to an integrated circuit, particularly an analog integrated circuit, including at least a circuit arrangement of the type described hereinbefore.

These and other aspects of the invention are apparent from and will be elucidated with reference to the embodiments described hereinafter.

Figure 2:
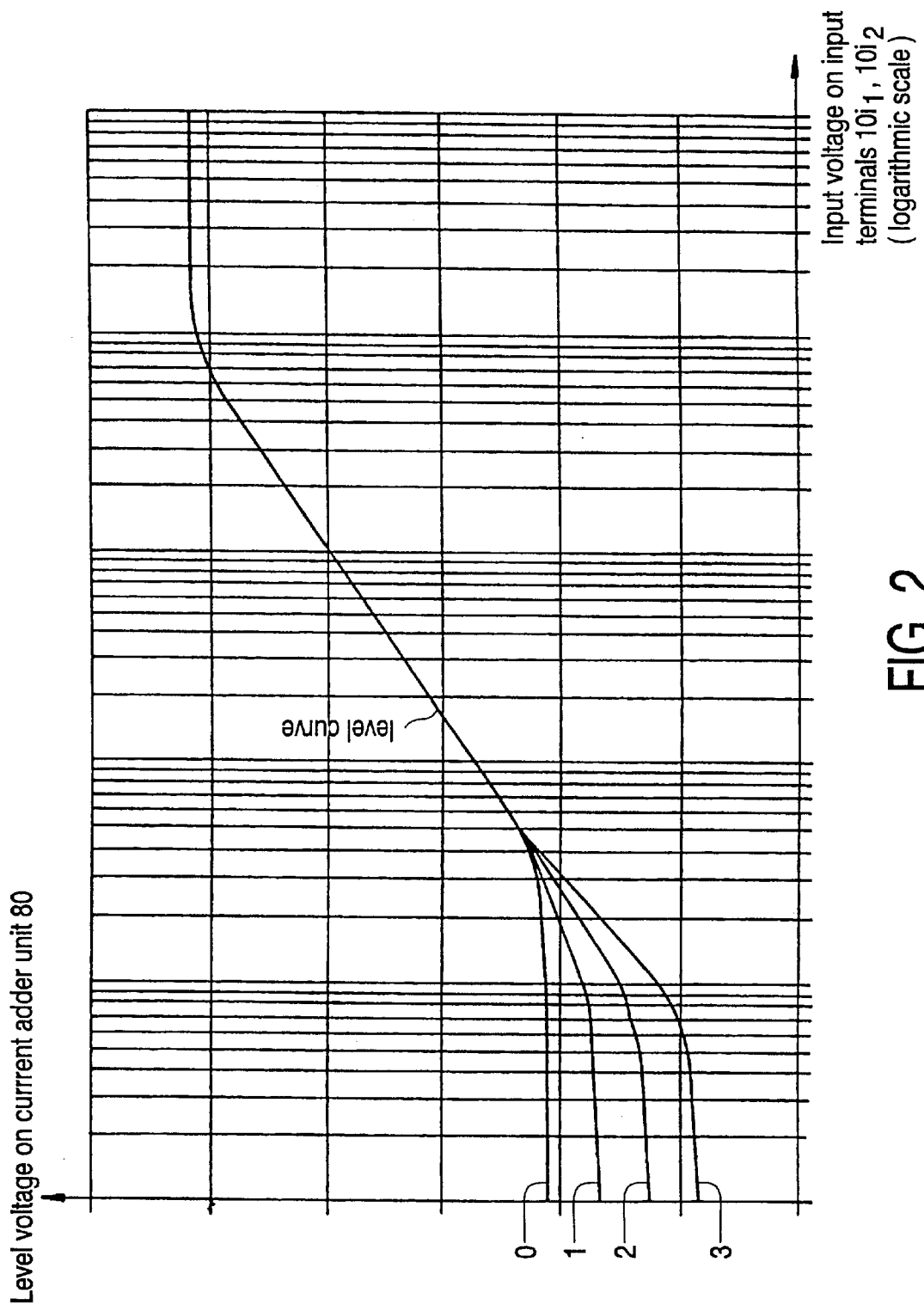
Figure 3:
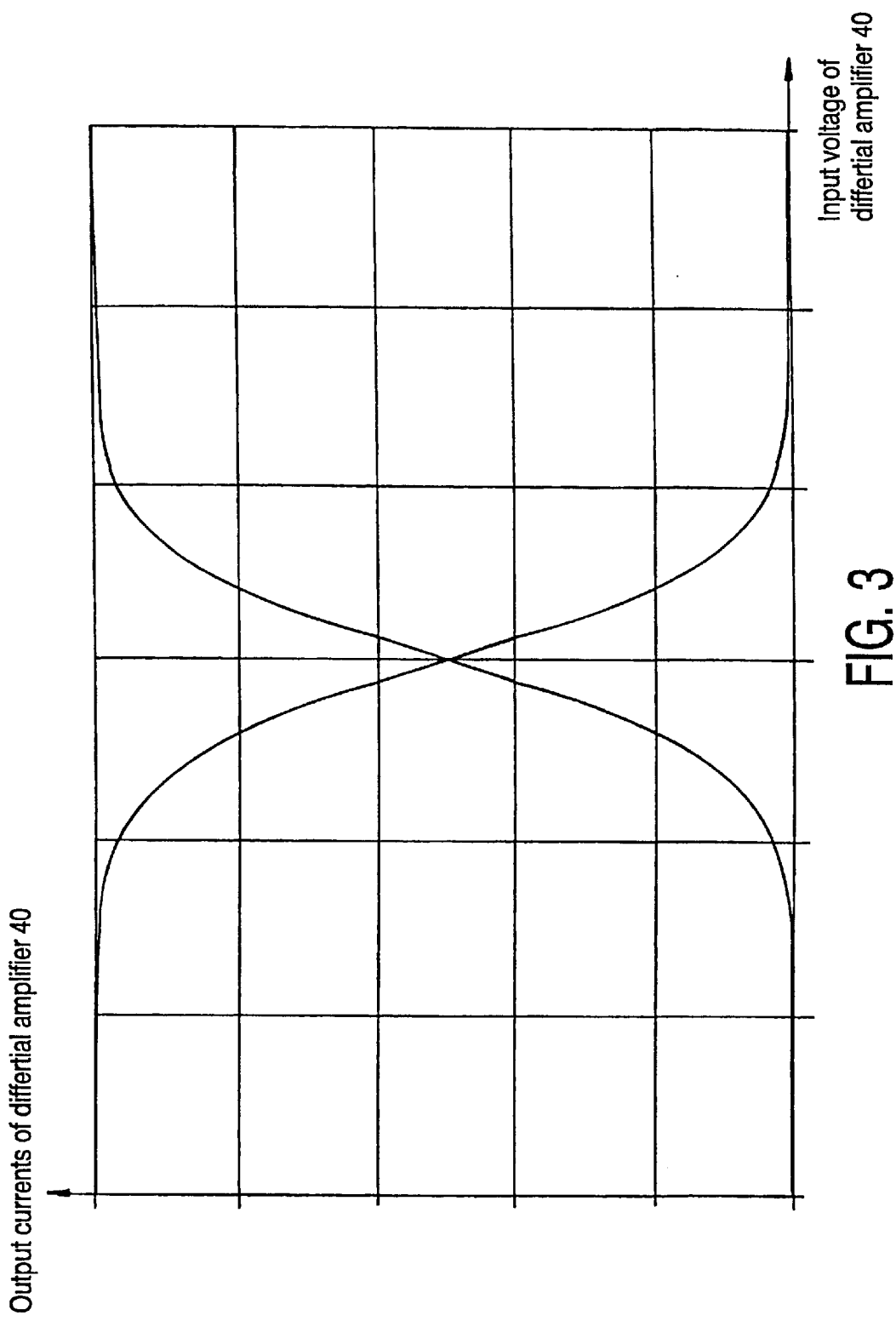
Figure 4:
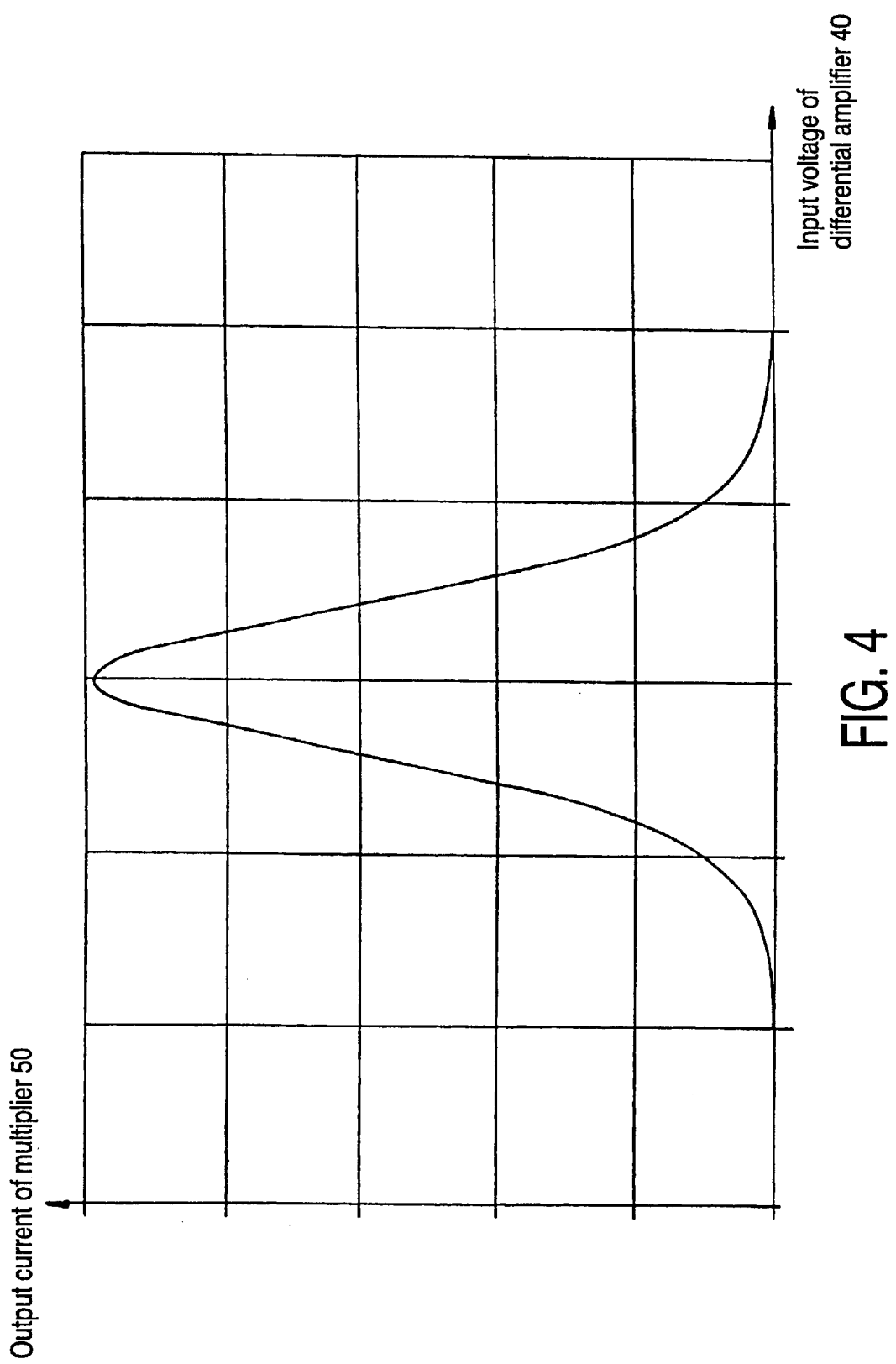

In the drawings:

FIG. 1 shows diagrammatically an embodiment of a circuit arrangement according to the invention, FIG. 2 is a diagram showing the level characteristic of the circuit arrangement of FIG. 1, i.e. the level voltage as an output voltage plotted against the input voltage of the circuit arrangement, FIG. 3 is a diagram showing the two output signals (collector currents) of a differential amplifier stage plotted against the DC input voltage of the differential amplifier stage, and FIG. 4 is a diagram showing the product of the values of the two output signals (collector currents) of the differential amplifier stage, i.e. the output signal of a multiplier stage plotted against the DC input voltage of the differential amplifier stage.

The circuit arrangement 100 shown by way of example in FIG. 1 is provided for generating and amplifying a DC signal whose level voltage measured at a current adder unit 80 is essentially proportional to the logarithm of the voltage amplitude of the input signal (cf. FIG. 2).

To this end, the circuit arrangement 100 comprises an amplifier circuit having three amplifier stages 10, 20, 30. Each amplifier stage 10, 20, 30 comprises two NPN transistors 12, 14; 22, 24; 32, 34 whose respective emitters 126, 146; 226, 246; 326, 346 are interconnected.

To generate a DC voltage, which in wide ranges is proportional to the logarithm of the amplitude of the voltage of the input signals supplied via the first input terminal $10i_1$ of the first amplifier stage 10 and via the second input terminal $10i_2$ of the first amplifier stage 10, at least a rectifier stage 15, 25, 35 is provided within each amplifier stage 10, 20, 30, respectively. Each rectifier stage 15, 25, 35 comprises two NPN transistors 16, 18; 26, 28; 36, 38 whose respective emitters 166, 186; 266, 286; 366, 386 are interconnected.

As a significant contribution should be made to the level characteristic already at input signals below the rectifying action of the emitter followers (collector circuits) of the last amplifier stage 30 (cf. FIG. 2), a non-negatively fed-back differential amplifier stage 40 is arranged parallel to the last amplifier stage 30. Particularly, an output terminal $30o_1$, $30o_2$ of the last amplifier stage 30 is connected to the respective bases 424, 444 of the transistors 42, 44.

This differential amplifier stage 40 is connected to a current source 46 and comprises two PNP transistors 42 and 44 whose respective emitters 426, 446 are interconnected and are connected to the current source 46. As is further shown in FIG. 1, the differential amplifier stage 40 precedes a multiplier stage 50 for multiplying the output signals of the differential amplifier stage 40 (cf. FIG. 3–FIG. 4). This multiplied output signal, or more precisely its level voltage, is then added in the current adder unit 80 to the relevant level voltage of the amplifier stages 10; 20 preceding the last amplifier stage 30.

As is shown in FIG. 2, the characteristic of the level voltage of the circuit arrangement 100 can be extended towards smaller level voltages of the circuit arrangement 100 by increasing the current supplied by the current source 46.

This is shown in FIG. 2 in so far that, at the level characteristic denoted by the parameter "0", the extension stage composed of the differential stage 40 and the multiplier stage 50 is currentless and therefore inactive (no extension of the level characteristic towards smaller level voltages), whereas, at the level characteristics denoted by the parameters "1", "2" and "3", the extension stage composed of the differential amplifier stage 40 and the multiplier stage 50 is fed with ever increasing currents from the current source 46 and is therefore active (extension or lengthening of the level characteristic towards increasingly smaller level voltages).

The multiplier stage 50 comprises four NPN transistors 52, 54, 56 and 58 whose collectors 522, 562 are connected to a power supply $U_s$ and whose respective collectors 542, 582 are connected to the output terminal 500o of the multiplier stage 50. The respective bases 524, 584 of the first NPN transistor 52 and the fourth NPN transistor 58 are connected to the collector 422 of the first transistor 42 of the differential amplifier stage 40. Furthermore, the respective bases 524, 584 of the first NPN transistor 52 and the fourth NPN transistor 58, as well as the respective bases 544, 564 of the second NPN transistor 54 and the third NPN transistor 56 are interconnected. The respective emitters 526, 546 of the first NPN transistor 52 and the second NPN transistor 54, as well as the respective emitters 566, 586 of the third NPN transistor 56 and the fourth NPN transistor 58 are interconnected.

The differential voltage between the bases 524 and 584, on the one hand, and the bases 544 and 564, on the other hand, represents one multiplier input signal while the differential current between the sum of the currents of the emitters 526 and 546, on the one hand, and the sum of the currents of the emitters 566 and 586, on the other hand, represents the second multiplier input signal. This type of multiplier is also known as a 4-quadrant multiplier comprising two cross-coupled differential amplifiers.

FIG. 1 further shows that a current mirror stage 70 is assigned to the differential amplifier stage 40 and the multiplier stage 50. The collectors 422, 442 of the transistors 42, 44 are connected to the current mirror stage 70 via an intermediate stage 60, which intermediate stage 60 comprises two NPN transistors 62 and 64 whose collectors 622 and 642 are connected to the respective bases 624 and 644 and collectors 422 and 442 of the transistors 42 and 44 of the differential amplifier stage 40, and whose emitters 626 and 646 are connected to the input terminals of the current mirror stage 70.

The current mirror stage 70 comprises four NPN transistors 72, 74, 76, 78 whose respective bases 724, 744, and 764, 784 are interconnected and are connected to a collector 722, 782, and whose respective emitters 726, 746, and 766, 786 are interconnected and are connected to a reference potential, namely ground potential.

The circuit arrangement 100 shown by way of example in FIG. 1 provides, at a smaller current consumption, an increase of the level indication or an extension of the level characteristic towards smaller voltages (cf. FIG. 2) without an offset problem and/or a negative feedback problem.

List of Reference Signs 100 circuit arrangement 10 first amplifier stage $10i_1$ first input terminal of the first amplifier stage 10

$10i_2$ second input terminal of the first amplifier stage 10

12 first transistor, particularly first NPN transistor, of the first amplifier stage 10

126 emitter of the first transistor 12 of the first amplifier stage 10

14 second transistor, particularly second NPN transistor, of the first amplifier stage 10

146 emitter of the second transistor 14 of the first amplifier stage 10

15 first rectifier stage 16 first transistor, particularly first NPN transistor, of the first rectifier stage 15

166 emitter of the first transistor 16 of the first rectifier stage 15

18 second transistor, particularly second NPN transistor, of the first rectifier stage 15

186 emitter of the second transistor 18 of the first rectifier stage 15

20 second amplifier stage 22 first transistor, particularly first NPN transistor, of the second amplifier stage 20

226 emitter of the first transistor 22 of the second amplifier stage 20

24 second transistor, particularly second NPN transistor, of the second amplifier stage 20

246 emitter of the second transistor 24 of the second amplifier stage 20

25 second rectifier stage 26 first transistor, particularly first NPN transistor, of the second rectifier stage 25

266 emitter of the first transistor 26 of the second rectifier stage 25

28 second transistor, particularly second NPN transistor, of the second rectifier stage 25

286 emitter of the second transistor 28 of the second rectifier stage 25

30 third amplifier stage=last amplifier stage

30$o_1$ first output terminal of the last amplifier stage 30
30$o_2$ second output terminal of the last amplifier stage 30
300$o$ level voltage output of the amplifier stages 10, 20, 30
32 first transistor, particularly first NPN transistor, of the last amplifier stage 30
32$6$ emitter of the first transistor 32 of the last amplifier stage 30
34 second transistor, particularly second NPN transistor, of the last amplifier stage 30
34$6$ emitter of the second transistor 34 of the last amplifier stage 30
35 third rectifier stage=last rectifier stage
36 first transistor, particularly first NPN transistor, of the last rectifier stage 35
36$6$ emitter of the first transistor 36 of the last rectifier stage 35
38 second transistor, particularly second NPN transistor, of the last rectifier stage 35
38$6$ emitter of the second transistor 38 of the last rectifier stage 35
40 differential amplifier stage
40$i_1$ first input terminal of the differential amplifier stage 40
40$i_2$ second input terminal of the differential amplifier stage 40
42 first transistor, particularly first NPN transistor, of the differential amplifier stage 40
422 collector of the first transistor 42 of the differential amplifier stage 40
424 base of the first transistor 42 of the differential amplifier stage 40
426 emitter of the first transistor 42 of the differential amplifier stage 40
44 second transistor, particularly second NPN transistor, of the differential amplifier stage 40
442 collector of the second transistor 44 of the differential amplifier stage 40
444 base of the second transistor 44 of the differential amplifier stage 40
446 emitter of the second transistor 44 of the differential amplifier stage 40
46 current source
50 multiplier stage
500$o$ output terminal of the multiplier stage 50
52 first transistor, particularly first NPN transistor, of the multiplier stage 50
522 collector of the first transistor 52 of the multiplier stage 50
524 base of the first transistor 52 of the multiplier stage 50
526 emitter of the first transistor 52 of the multiplier stage 50
54 second transistor, particularly second NPN transistor, of the multiplier stage 50
542 collector of the second transistor 54 of the multiplier stage 50
544 base of the second transistor 54 of the multiplier stage 50
546 emitter of the second transistor 54 of the multiplier stage 50
56 third transistor, particularly third NPN transistor, of the multiplier stage 50
562 collector of the third transistor 56 of the multiplier stage 50
564 base of the third transistor 56 of the multiplier stage 50
566 emitter of the third transistor 56 of the multiplier stage 50
58 fourth transistor, particularly fourth NPN transistor, of the multiplier stage 50
582 collector of the fourth transistor 58 of the multiplier stage 50
584 base of the fourth transistor 58 of the multiplier stage 50
586 emitter of the fourth transistor 58 of the multiplier stage 50
60 intermediate stage
62 first transistor, particularly first NPN transistor, of the intermediate stage 60
622 collector of the first transistor 62 of the intermediate stage 60
624 base of the first transistor 62 of the intermediate stage 60
626 emitter of the first transistor 62 of the intermediate stage 60
64 second transistor, particularly second NPN transistor, of the intermediate stage 60
642 collector of the second transistor 64 of the intermediate stage 60
644 base of the second transistor 64 of the intermediate stage 60
646 emitter of the second transistor 64 of the intermediate stage 60
70 current mirror stage
72 first transistor, particularly first NPN transistor, of the current mirror stage 70
722 collector of the first transistor 72 of the current mirror stage 70
724 base of the first transistor 72 of the current mirror stage 70
726 emitter of the first transistor 72 of the current mirror stage 70
74 second transistor, particularly second NPN transistor, of the current mirror stage 70
742 collector of the second transistor 74 of the current mirror stage 70
744 base of the second transistor 74 of the current mirror stage 70
746 emitter of the second transistor 74 of the current mirror stage 70
76 third transistor, particularly third NPN transistor, of the current mirror stage 70
762 collector of the third transistor 76 of the current mirror stage 70
764 base of the third transistor 76 of the current mirror stage 70
766 emitter of the third transistor 76 of the current mirror stage 70
78 fourth transistor, particularly fourth NPN transistor, of the current mirror stage 70
782 collector of the fourth transistor 78 of the current mirror stage 70
784 base of the fourth transistor 78 of the current mirror stage 70

786 emitter of the fourth transistor 78 of the current mirror stage 70

80 current adder unit $U_s$ power supply voltage

What is claimed is:

1. A circuit arrangement (100) for generating and amplifying a DC signal, referred to as level voltage, whose value is essentially proportional to the logarithm of the voltage amplitude of the input signal, the circuit arrangement comprising an amplifier circuit having at least two amplifier stages (10; 20; 30), characterized in that at least a differential amplifier stage (40), in particular non-negatively fed back, is arranged parallel to the last amplifier stage (30), particularly parallel to the collector circuits of the last amplifier stage (30), the differential amplifier stage (40) precedes at least a multiplier stage (50) for multiplying the output signals of the differential amplifier stage (40), for generating two differential amplifier output signals which are to be multiplied by each other, and alternatively to the differential amplifier (40), the collector currents of the transistors (36, 38) of the rectifier circuit (35) of the last amplifier stage (30) are used, and at least a current adder unit (80) is provided for adding the level voltage of the output signal of the multiplier stage (50) to the respective level voltage of the other amplifier stages.

2. A circuit arrangement (100) as claimed in claim 1, characterized in that at least a current mirror stage (70) is assigned to the differential amplifier stage (40) and the multiplier stage (50).

3. A circuit arrangement (100) as claimed in claim 1, characterized in that the differential amplifier stage (40) has at least two transistors (42, 44), particularly PNP transistors, and the differential amplifier stage (40) is connected to at least a current source (46).

4. A circuit arrangement (100) as claimed in claim 3, characterized in that the emitters (426, 446) of the transistors (42, 44) are interconnected and are connected to the current source (46).

5. A circuit arrangement (100) as claimed in claim 3, characterized in that the characteristic curve of the level voltage of the circuit arrangement (100) can be extended towards smaller level voltages of the circuit arrangement (100) by increasing the value of the current supplied by the current source (46), and/or interpositioning high-ohmic resistors.

6. A circuit arrangement (100) as claimed in claim 3, characterized in that an output terminal ($30o_1$, $30o_2$) of the last amplifier stage (30) is connected to the respective base (424, 444) of the transistors (42, 44).

7. A circuit arrangement (100) as claimed in claim 2, characterized in that the collectors (422, 442) of the transistors (42, 44) are connected to the current mirror stage (70) via at least an intermediate stage (60).

8. A circuit arrangement (100) as claimed in claim 7, characterized in that the intermediate stage (60) comprises at least two transistors (62, 64), particularly NPN transistors, whose respective collectors (622, 642) are connected to the respective bases (624, 644) and the respective collector (422, 442) of the transistors (42, 44) of the differential amplifier stage (40), and whose respective emitters (626, 646) are connected to the input terminals of the current mirror stage (70).

9. A circuit arrangement (100) as claimed in claim 1, characterized in that the multiplier stage (50) comprises at least four transistors (52, 54, and 56, 58), particularly NPN transistors, whose respective collectors (522, 562) are connected to a power supply voltage (Us) and whose respective collectors (542, 582) are connected to the output terminal (500o) of the multiplier stage (50), whose respective bases (524, 584) are connected to the collector (422) of the first transistor (42) of the differential amplifier (40) and whose respective bases (544, 564) are interconnected, and whose respective emitters (526, 546, and 566, 586) are interconnected.

10. A circuit arrangement (100) as claimed in claim 1, characterized in that the current mirror stage (70) comprises at least four transistors (72, 74, and 76, 78), particularly NPN transistors, whose respective bases (724, 744, and 764, 784) are interconnected and are connected to a respective collector (722, 782), and whose respective emitters (726, 746, and 766, 786) are interconnected and are connected to a reference potential.

11. A circuit arrangement (100) as claimed in claim 10, characterized in that the reference potential is the ground potential and/or mass potential.

12. A circuit arrangement (100) as claimed in claim 1, characterized in that each amplifier stage (10; 20; 30) comprises at least two transistors (12, 14; 22, 24; 32, 34), particularly at least two NPN transistors, whose respective emitters (126, 146; 226, 246; 326, 346) are interconnected.

13. A circuit arrangement (100) as claimed in claim 1, characterized in that each amplifier stage (10; 20; 30) incorporates at least a rectifier stage (15; 25; 35).

14. A circuit arrangement (100) as claimed in claim 13, characterized in that each amplifier stage (15; 25; 35) comprises at least two transistors (16, 18; 26, 28; 36, 38), particularly at least two NPN transistors, whose respective emitters (166, 186; 266, 286; 366, 386) are interconnected.

15. An integrated circuit, particularly an analog integrated circuit, including at least a circuit arrangement (100) as claimed in claim 1.

* * * * *